United States Patent
Lee

(10) Patent No.: US 7,019,555 B2
(45) Date of Patent: Mar. 28, 2006

(54) CIRCUIT FOR PERFORMING ON-DIE TERMINATION OPERATION IN SEMICONDUCTOR MEMORY DEVICE AND ITS METHOD

(75) Inventor: Sang-Hee Lee, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 53 days.

(21) Appl. No.: 10/879,682

(22) Filed: Jun. 28, 2004

(65) Prior Publication Data

US 2005/0134304 A1 Jun. 23, 2005

(30) Foreign Application Priority Data

Dec. 19, 2003 (KR) .................... 10-2003-0093658

(51) Int. Cl.
*A03K 19/003* (2006.01)
(52) U.S. Cl. ............................ 326/30; 326/28; 326/82
(58) Field of Classification Search ................ 365/198, 365/200, 189.03; 327/108, 112; 326/21, 326/26–28, 30, 82

See application file for complete search history.

(56) References Cited

U.S. PATENT DOCUMENTS 6,768,393 B1 * 7/2004 Song ...................... 333/22 R
6,917,546 B1 * 7/2005 Matsui .................... 365/198

\* cited by examiner

*Primary Examiner*—Anh Q. Tran
(74) *Attorney, Agent, or Firm*—Blakely Sokoloff Taylor & Zafman

(57) ABSTRACT

A circuit for performing an on-die termination operation includes a clock buffer for outputting first and second buffered clocks using an external clock and an external inverting clock applied thereto externally; an on-die termination buffer for comparing each other an ODT signal and a reference voltage, which are applied thereto from an external chip set, to generate an on-die termination comparison signal; a first flip-flop member for transferring the on-die termination comparison signal as a plurality of parallel output signals based on the first and second buffered clocks outputted from the clock buffer; and a plurality of second flip-flop members, which corresponds to each of the parallel output signals outputted from the first flip-flop member, for transferring the parallel output signals outputted from the first flip-flop member based on delayed lock loop clocks outputted from a delayed lock loop.

15 Claims, 7 Drawing Sheets

CIRCUIT FOR PERFORMING ON-DIE TERMINATION OPERATION IN SEMICONDUCTOR MEMORY DEVICE AND ITS METHOD

FIELD OF INVENTION

The present invention relates to an On-Die Termination ("ODT") technique in semiconductor memory device.

DESCRIPTION OF PRIOR ART

The ODT technique has been introduced to minimize a signal reflection in an interface between a system based on SSTL (Stub Series Termination Logic)_ and a memory storage device, thereby improving a signal integrity. In a conventional DDR-_ SDRAM, a termination voltage (VTT) and a termination resistor (RTT) provided by a motherboard is controlled by a memory controller through the use of the ODT technique, thereby allowing a termination to be provided at DRAM.

First, the simple description will be directed to the termination.

It is assumed that there are two ranks on a memory module. When a memory controller reads data from DRAM of a first rank Rank1, the memory controller applies an ODT signal of a high level state to DRAM of a second rank Rank2. In the occasion, the DRAM the second rank Rank2 forms a termination on a data bus, which shares with the first rank Rank1. Such case is referred to as the creation of termination resistor ("RTT").

FIG. 1 is a block diagram of primary portions in the prior art which performs the ODT operation; and FIG. 2 is a conventional timing chart of the ODT.

In FIG. 1, there is shown a block diagram of primary portions in the prior art, which performs the ODT operation. The prior art includes: an ODT buffer 110 for comparing each other an ODT signal and a reference voltage Vref, which are applied thereto from an external chip set, to generate an ODT comparison signal ODT1; a first flip-flop member 120 for transferring the ODT comparison signal ODT1 based on first and second buffered clocks iclk and iclkb outputted from a clock buffer; a second flip-flop member 130 for transferring the output of the first flip-flop member 120 based on delayed lock loop clocks rclk_dll, rclk_dllb, fclk_dll and fclk_dllb outputted from a delayed locked loop; an ODT enable signal generating member 140 for generating an ODT enable signal, which turns on/off the RTT through the use of the output from the second flip-flop member 130; and a plurality of ODT drivers 150-1, 150-2, ..., 150-N for intermitting outputting of data through the use of a plurality of ODT enable signals parallel-outputted from the ODT enable signal generating member 140.

Each of the plurality of ODT drivers 150-1, 150-2, ..., 150-N is used for a data signal DQ, a data strobe signal DQS, a data strobe bar signal DQSB, a read data strobe signal RDQS, and a read data strobe bar signal RDQSB, a data mask signal DM and the like.

Specifically, in the prior art only the ODT driver 150 among the abovementioned components is employed for transfer of the signals. Each signal is delivered to each pad through the use of the ODT enable signal ODT_enable outputted from the ODT enable signal generating member 140, then a deviation between maximum and minimum of an ODT turn-on time tAON and an ODT turn-off time tAOF at each pin is increased. In addition, in case a semiconductor memory device using a dual pad such as DDR-_16, a deviation between distances which the ODT enable signal ODT_enale is delivered to each pads is more increased. Herein, the ODT turn-on time tAON and the ODT turn-off time tAOF are values which should satisfy a specification of 2[tCK]±(tAC+_), 2.5[tCK]±(tAC+_), based on DLL clocks, respectively, as shown in FIG. 2 of a general ODT timing chart.

Further, two- or four-stage of inverters are required to provide a driving force enough to transfer the ODT enable signal ODT_enable to the ODT driver 150, thereby allowing the ODT turn-on time tAON to be delayed by the requirement from a rising clock rclk_dll, and the ODT turn-off time tAOF from a falling clock fclk_dll. As a result, the prior art suffers from the disadvantage that there is likelihood of excess of the ODT turn-on time tAON and the ODT turn-off time tAOF over required maximum specifications.

Specifically, when the ODT enable signal ODT_enable is delivered to each pin according to the prior art, it suffers from the disadvantages that there is directly affected a distance deviation from the ODT enable signal generating member to each pin, and two- or four-stage of inverters are required for a driving force of the enable signal, in layout. It results in a delay corresponding to the number of required inverter stages, and the required specifications of the ODT turn-on time tAON and the ODT turn-off time tAOF are not satisfied.

SUMMARY OF INVENTION

It is, therefore, an object of the present invention to provide a circuit and its method which is capable of providing ODT associated control signals by the number of pads, prior to receiving clocks from a delayed locked loop.

It is another object of the present invention to provide a circuit and its method which minimizes the effect of a delay on an ODT turn-on time tAON and an ODT turn-off time tAOF, the delay occurring due to architectures needed to a driving force of ODT associated control signals.

In accordance with a preferred embodiment of the present invention, there is provided to a circuit for performing an on-die termination ("ODT") operation in a semiconductor memory device, which comprises: a clock buffer for outputting first and second buffered clocks using an external clock and an external inverting clock applied thereto externally; an on-die termination buffer for comparing each other an ODT signal and a reference voltage, which are applied thereto from an external chip set, to generate an on-die termination comparison signal; a first flip-flop member for transferring the on-die termination comparison signal as a plurality of parallel output signals based on the first and second buffered clocks outputted from the clock buffer; and a plurality of second flip-flop members, which corresponds to each of the parallel output signals outputted from the first flip-flop member, for transferring the parallel output signals outputted from the first flip-flop member based on delayed lock loop clocks outputted from a delayed lock loop.

Preferably, the first flip-flop member further includes a member for increasing a driving force of the plurality of parallel output signals.

Preferably, the second flip-flop member further includes a member for increasing a driving force of the plurality of parallel output signals outputted from the first flip-flop member, prior to the control of the delayed lock loop clocks provided from the delayed locked loop.

Preferably, the number of the plurality of second flip-flop members is equal to that of pads in the semiconductor memory device.

Preferably, in accordance with the present invention, the circuit further comprises: a plurality of on-die termination enable signal generating members, which corresponds to each of the plurality of second flip-flop members, for generating on-die termination enable signals for turning on/off a termination resistor through the use of the outputs from the second flip-flop members; and a plurality of on-die termination drivers, which corresponds to each of the plurality of on-die termination enable signals generating members, for intermitting outputting of data through the use of the plurality of on-die termination enable signals.

Preferably, the increasing member is inverters, which are serially connected in even-number.

Further, in accordance with the present invention, there is a circuit for performing an on-die termination ("ODT") operation in a semiconductor memory device, which comprises: a means for increasing a driving force of signals which are outputted to each pad in the semiconductor memory device so as to perform the on-die termination operation; and a means for controlling the output signals from the driving force increasing means through the use of delayed lock loop clocks outputted from a delayed lock loop, wherein the means is parallel-connected in plural number.

Further, in accordance with the present invention, there is a method for performing an on-die termination ("ODT") operation in a semiconductor memory device, which comprises the steps of: (a) outputting first and second buffered clocks using an external clock and an external inverting clock applied thereto externally; (b) comparing each other an on-die termination signal and a reference voltage, which are applied thereto from an external chip set, to generate an on-die termination comparison signal; (c) transferring the on-die termination comparison signal as a plurality of parallel output signals based on the first and second buffered clocks; (d) increasing a driving force of the plurality of parallel output signals; and (e) outputting the parallel output signals with an increased driving force based on delayed lock loop clocks outputted from a delayed lock loop.

Preferably, the method further comprises the steps of: (f) generating on-die termination enable signals for turning on/off a termination resistor through the use of the outputs at the step (e); and (g) intermitting outputting of data through the use of the plurality of on-die termination enable signals.

In accordance with the present invention, it is capable of ensuring a time margin which satisfies specifications of an ODT turn-on time tAON and an ODT turn-off time tAOF, by removing two- or four-stage of inverters, which is needed to provide a driving force enough for allowing signals after the application of DLL clocks to be delivered to each pad.

Further, in accordance with the present invention, two- or four-stage of inverters are required between a first flip-flop member and a second flip-flop member in order to provide a driving force of signals outputted toward each pad. However, it is not affects on a maximum of the ODT turn-on time tAON and the ODT turn-off time tAOF. The reason for this is that the ODT turn-on time tAON and the ODT turn-off time tAOF are based on DLL clocks rclk_dll and fclk_dll provided from the second flip-flop member, and the two- or four-stage of inverters employed in the present invention is disposed at front of the second flip-flop member received the DLL clocks rclk_dll and fclk_dll. Therefore, the present invention is capable of increasing a time margin for a maximum specification of the ODT turn-on time tAON and the ODT turn-off time tAOF by the number of required stages of inverters.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF INVENTION

Hereinafter, a semiconductor memory device in accordance with the present invention will be described in detail referring to the accompanying drawings.

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Figure 1:
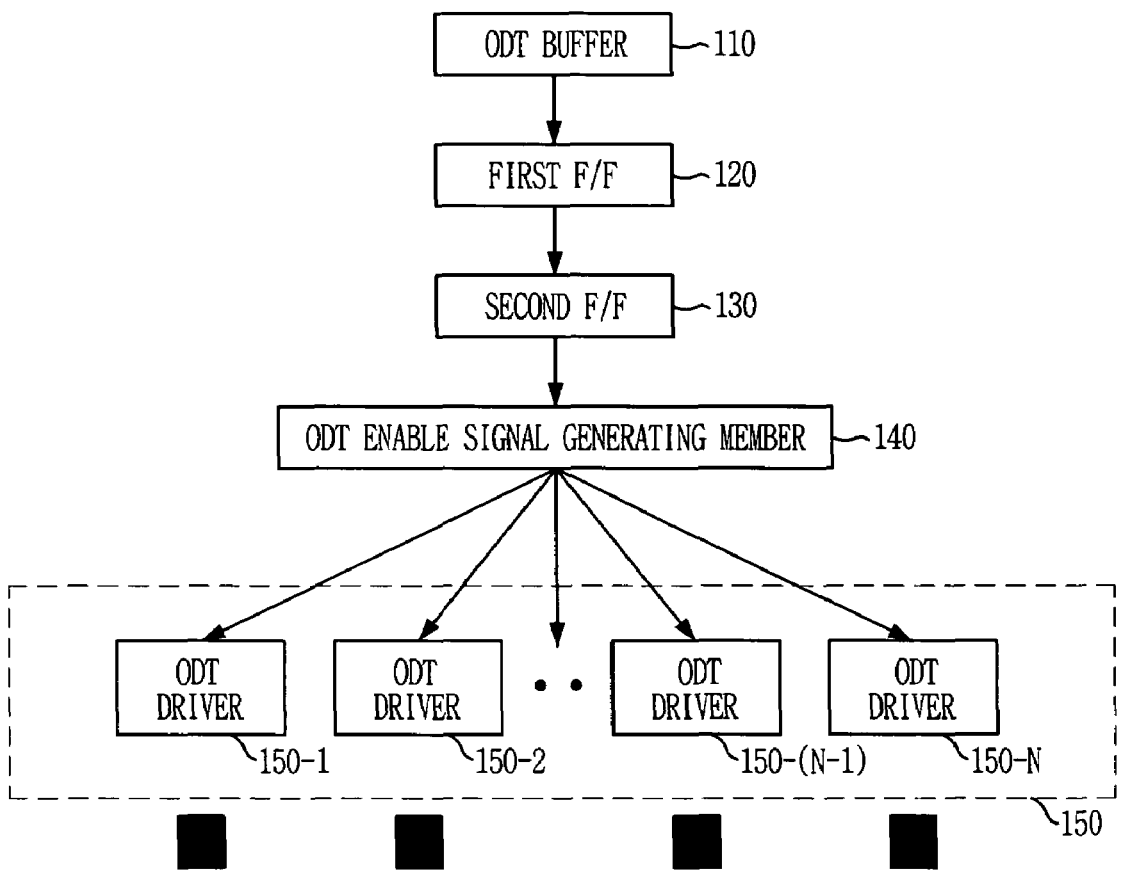
FIG. 1 is a block diagram of primary portions in the prior art which performs the ODT operation.
Figure 2:
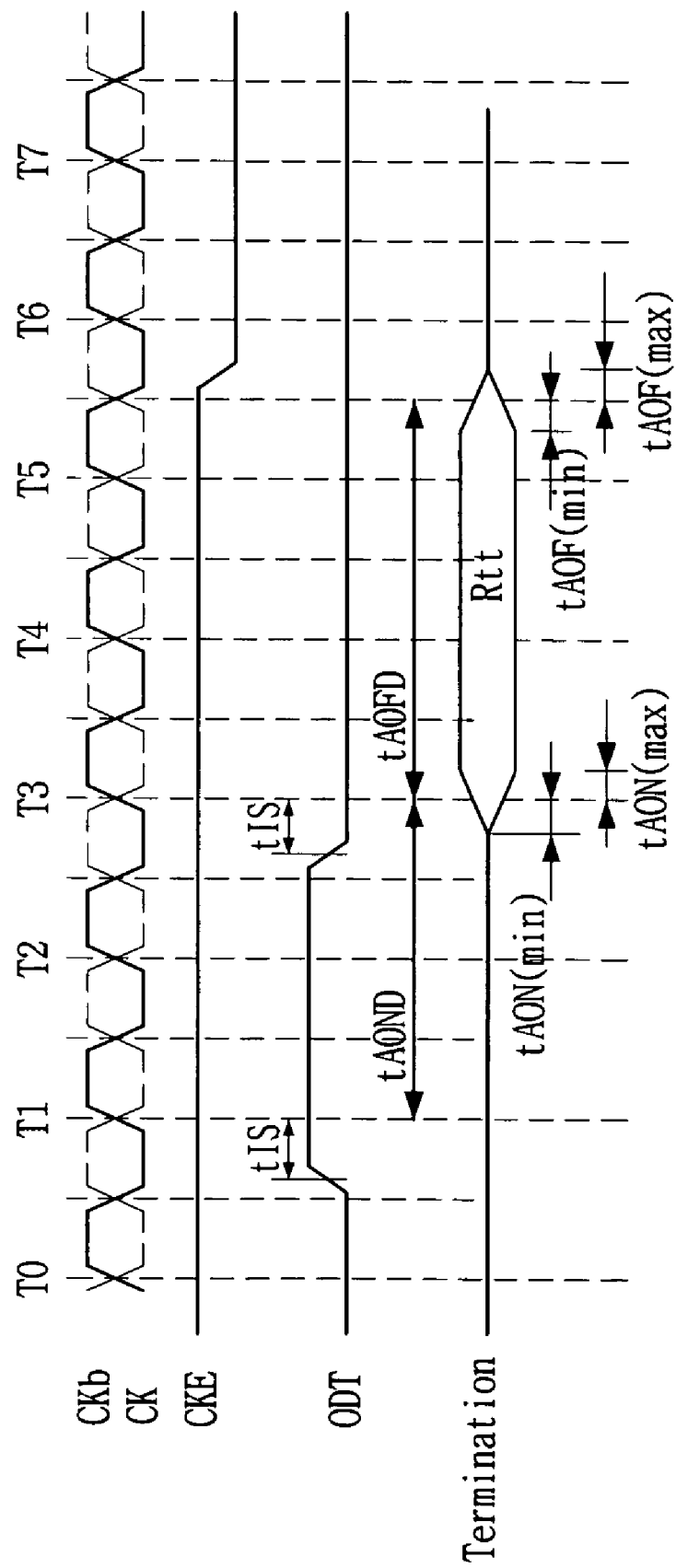
FIG. 2 is a conventional timing chart of the ODT.
Figure 3:
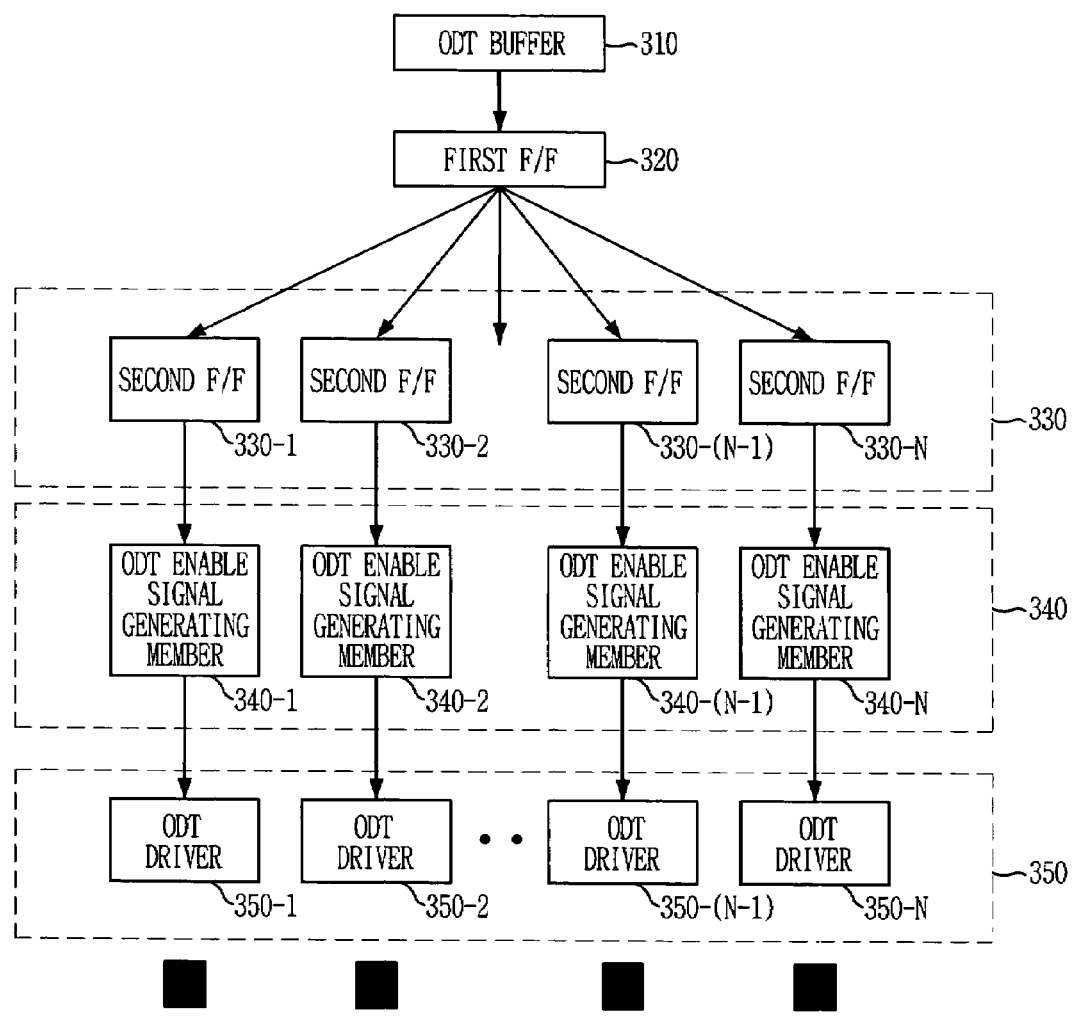
FIG. 3 is a block diagram of primary portions in a circuit in accordance with a preferred embodiment of the present invention.
Figure 4:
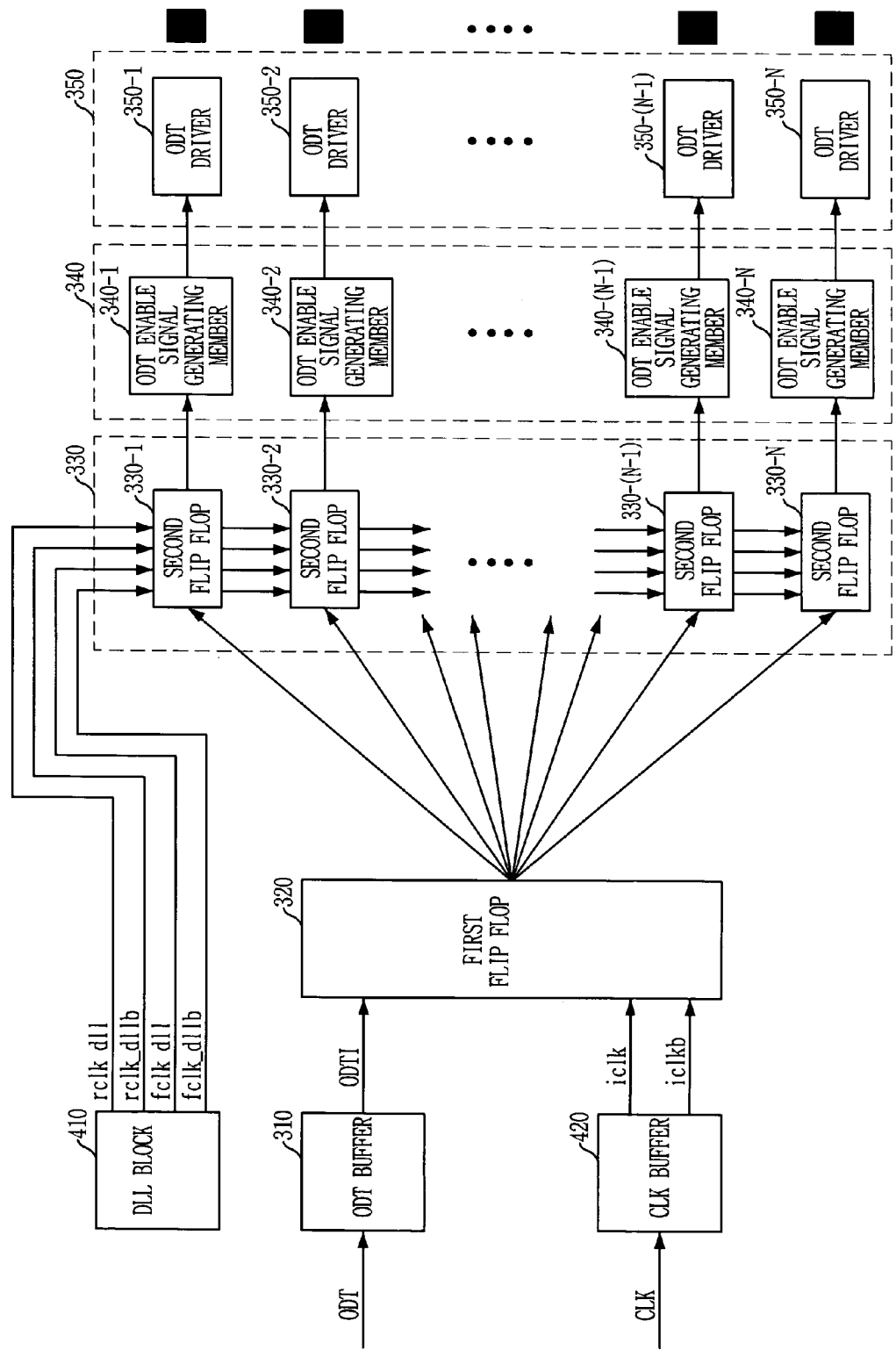
FIG. 4 is an entire block diagram in the circuit in accordance with a preferred embodiment of the present invention.

FIG. 3 is a block diagram of primary portions in a circuit in accordance with a preferred embodiment of the present invention, and FIG. 4 is an entire block diagram in the circuit in accordance with a preferred embodiment of the present invention.

In accordance with a preferred embodiment of the present invention, the circuit comprises: an ODT buffer 310; a first flip-flop member 320; a plurality of second flip-flop member 330-1, 330-2, . . . , 330-N; a plurality of ODT enable signal generating members 340-1, 340-2, . . . , 340-N; a plurality of ODT driver 350-1, 350-2, . . . , 350-N; a delayed lock loop 410; and clock buffer 420. A detailed function description of the respective member as follows.

The ODT buffer 310 compares each other ODT signal and a reference voltage Vref, which are applied thereto from an external chip set, to generate an ODT comparison signal ODT1. The first flip-flop member 320 transfers the ODT comparison signal ODT1 as a plurality of parallel output signals based on first and second buffered clocks iclk and iclkb outputted from a clock buffer 420 in FIG. 4. The plurality of the second flip-flop members 330-1, 330-2, . . . , 330-N, which corresponds to each of the parallel output signals outputted from the first flip-flop member 320, transfers the parallel output signals outputted from the first flip-flop member 320 based on DDL clocks rclk_dll, rclk_dllb, fclk_dll and fclk_dllb outputted from the delayed lock loop 410. The plurality of ODT enable signal generating members 340-1, 340-2, ..., 340-N generates an ODT enable signal for turning on/off the RTT through the use of the outputs from the second flip-flop member 330-1, 330-2, ..., 330-N. The plurality of ODT drivers 350-1, 350-2, ..., 350-N intermits outputting of data through the use of a plurality of ODT enable signals parallel-outputted from the ODT enable signal generating members 340-1, 340-2, ..., 340-N. The delayed lock loop 410 outputs a rising clock rclk and a falling clock fclk using an external clock CLK and an external inverting clock CLKB. The clock buffer 420 outputs buffered clocks iclk and iclkb to be used in the first flip-flop member 320 using the external clock CLK and the external inverting clock CLKB. Herein, it is preferable to equal the number of the plurality of second flip-flop members 330-1, 330-2, ..., 330-N, ODT enable signal generating members 340-1, 340-2, ..., 340-N, and the plurality of ODT drivers 350-1, 350-2, ..., 350-N to that of pads in the semiconductor memory device.

The plurality of second flip-flop members 330-1, 330-2, ..., 330-N, the plurality of ODT enable signal generating members 340-1, 340-2, ..., 340-N, and the plurality of ODT drivers 350-1, 350-2, ..., 350-N are used with respect to each pad, thereby leading to meet specifications of the ODT turn-on time tAON and the ODT turn-off time tAOF in the semiconductor memory device operating at a high frequency.

Figure 5:
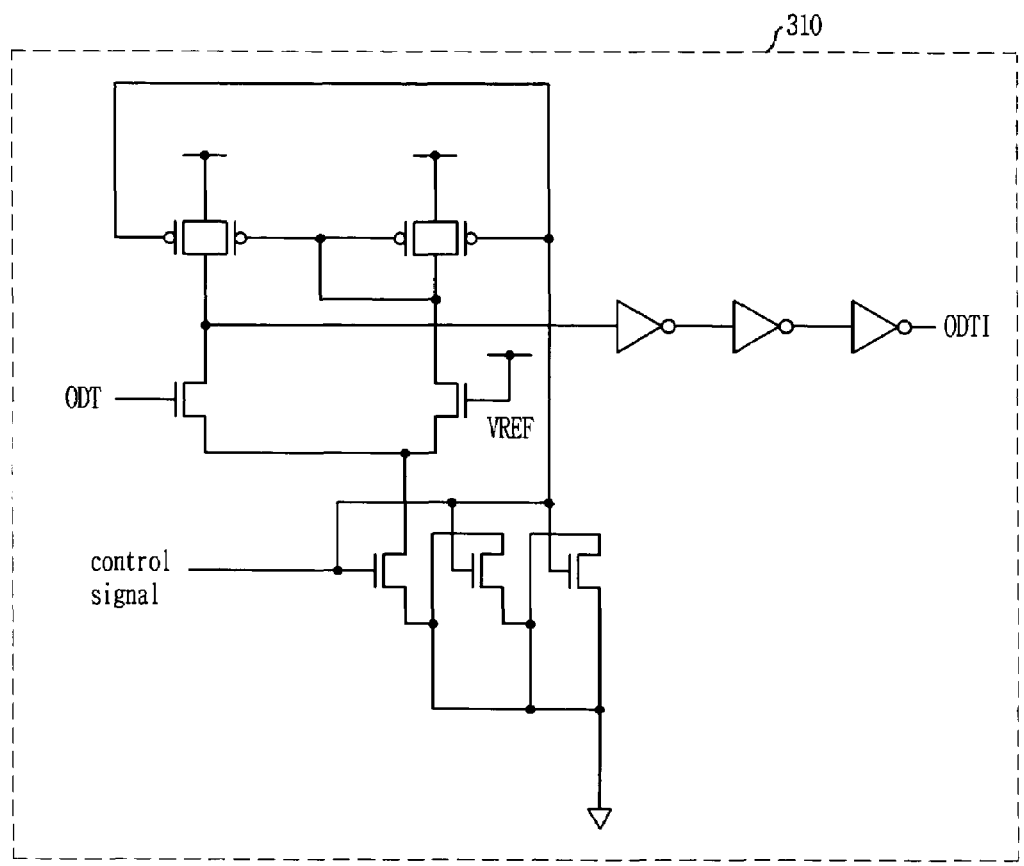
FIG. 5 is a circuit diagram of the ODF buffer shown in FIG. 4.

FIG. 5 is a circuit diagram of the ODF buffer shown in FIG. 4.

The ODT buffer 310 compares each other ODT signal and a reference voltage Vref, which are applied thereto from an external chip set, to generate an ODT comparison signal ODT1.

Figure 6:
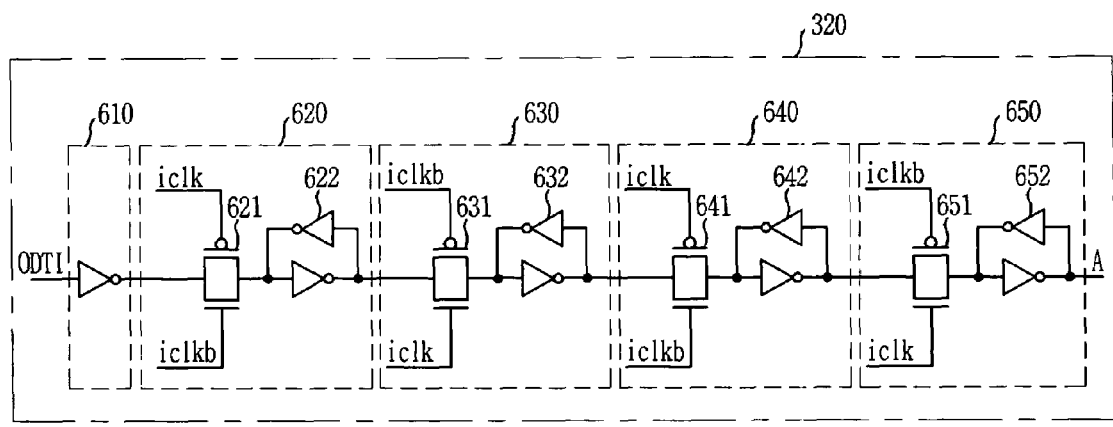
FIG. 6 is a detailed circuit diagram of the first flip-flop member shown in FIG. 4.

FIG. 6 is a detailed circuit diagram of the first flip-flop member 320 shown in FIG. 4.

The first flip-flop member 320 includes an inverter 610, and first to fourth latch members 620, 630, 640, 650 which are serially connected to the inverter 610. A detailed function description of the first flip-flop member 320 as follows.

The inverter 610 inverts the ODT comparison signal ODT1. The first latch member 620 includes a transfer gate 621 for transferring the output of the inverter 610 using the first buffered clock iclk of a low level state, and an invert-parallel-connected inverter 622 for latching the output of the transfer gate 621. The second latch member 630 includes a transfer gate 631 for transferring the output of the inverter 620 using the second buffered clock iclkb of a low level state, and an invert-parallel-connected inverter 632 for latching the output of the transfer gate 631. The configuration of the third latch member 640 is identical to that of the first latch member 620 except that the output of the second latch member 630 is used as its input. Similarly, the configuration of the fourth latch member 650 is identical to that of the second latch member 630 except that the output of the third latch member 640 is used as its input.

Figure 7:
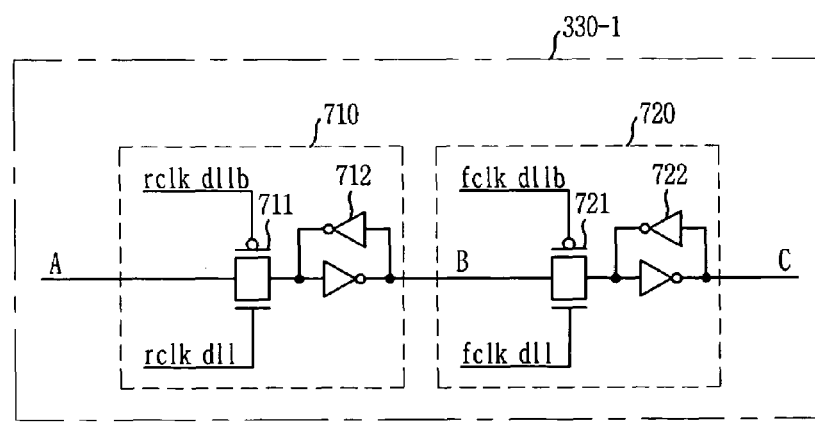
FIG. 7 is a detailed circuit diagram of any one of the plurality of second flip-flop members.

FIG. 7 is a detailed circuit diagram of any one of the plurality of second flip-flop members, wherein each member has the same configuration and only illustrated one.

The second flip-flop member 330-1 includes a rising clock control latch member 710 and a falling clock control latch member 720. A detailed function description of the second flip-flop member 330 as follows.

The rising clock control latch member 710 includes a transfer gate 711 for transferring the output of the first flip-flop member 320 using a rising clock rclk_dll of a high level state, and an invert-parallel-connected inverter 712 for latching the output of the transfer gate 711. The falling clock control latch member 720 includes a transfer gate 721 for transferring the output of the inverter 710 using a falling clock fclk_dll of a high level state, and an invert-parallel-connected inverter 722 for latching the output of the transfer gate 721.

Figure 8:
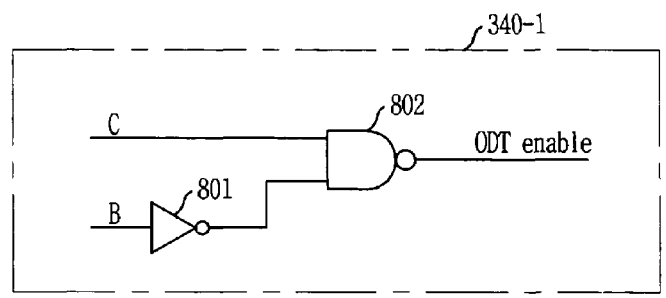
FIG. 8 is a detailed circuit diagram of any one of the plurality of ODT enable signal generating members.

FIG. 8 is a detailed circuit diagram of any one of the plurality of ODT enable signal generating members, wherein each member has the same configuration and only illustrated one.

The ODT enable signal generating member 340-1 includes an inverter 801 for inverting the output of the rising clock control latch member 710, and a NAND gate 802 having the output of the inverter 801 and the output of the falling clock control latch member 720 as its input. The output of the NAND gate 802 is the ODT enable signal ODT_enable.

Figure 9:
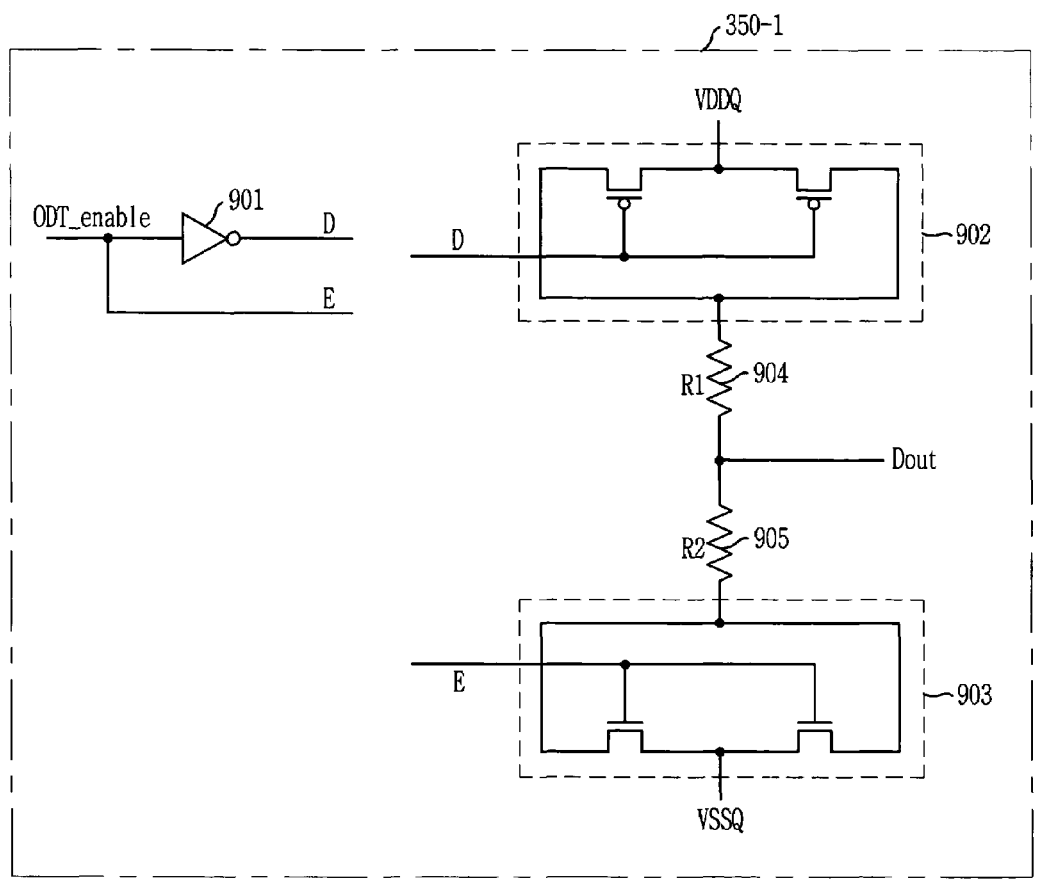
FIG. 9 is a detailed circuit diagram of any one of the plurality of ODT drivers.

FIG. 9 is a detailed circuit diagram of any one of the plurality of ODT drivers, wherein each has the same configuration and only illustrated one.

The ODT driver 350-1 includes an inverter 901 for inverting the ODT enable signal ODT_enable, a PMOS transistor 902 for outputting a power supply voltage VDDQ in response to the inverted ODT enable signal (i.e., the output of the inverter 901), a NMOS transistor 903 for outputting a ground voltage VSSQ in response to the ODT enable signal ODT_enable, and a plurality of resistors 904, 905 serially connected between the PMOS transistor 902 and the NMOS transistor 903.

Therefore, the present invention is capable of removing two- or four-stage of inverters, which is needed to provide a driving force enough for allowing signals after the application of DLL clocks to be delivered to each pad, thereby further ensuring a time margin which satisfies specifications of an ODT turn-on time tAON and an ODT turn-off time tAOF. Furthermore, the present invention restricts by DLL clocks factors affecting on deviations in an ODT turn-on time tAON and an ODT turn-off time tAOF at each pin, thereby easily satisfying specifications of the ODT turn-on time tAON and the ODT turn-off time tAOF in the semiconductor memory device operating at a high speed.

The present application contains subject matter related to Korean patent application No. 2003-93658, filed in the Korean Patent Office on Dec. 19, 2003, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. A circuit for performing an on-die termination ("ODT") operation in a semiconductor memory device, which comprises:
   a clock buffer for outputting first and second buffered clocks using an external clock and an external inverting clock applied thereto externally;
   an on-die termination buffer for comparing each other an ODT signal and a reference voltage, which are applied thereto from an external chip set, to generate an on-die termination comparison signal;
   a first flip-flop member for transferring the on-die termination comparison signal as a plurality of parallel output signals based on the first and second buffered clocks outputted from the clock buffer; and a plurality of second flip-flop members, which corresponds to each of the parallel output signals outputted from the first flip-flop member, for transferring the parallel output signals outputted from the first flip-flop member based on delayed lock loop clocks outputted from a delayed lock loop.

2. The circuit of claim 1, wherein the first flip-flop member includes a member for increasing a driving force of the plurality of parallel output signals.

3. The circuit of claim 2, wherein the second flip-flop member includes a member for increasing a driving force of the plurality of parallel output signals outputted from the first flip-flop member, prior to the control of the delayed lock loop clocks provided from the delayed locked loop.

4. The circuit of claims 3, wherein the number of the plurality of second flip-flop members is equal to that of pads in the semiconductor memory device.

5. The circuit of claim 4, further comprising:
a plurality of on-die termination enable signal generating members, which corresponds to each of the plurality of second flip-flop members, for generating on-die termination enable signals for turning on/off a termination resistor through the use of the outputs from the second flip-flop members; and
a plurality of on-die termination drivers, which corresponds to each of the plurality of on-die termination enable signals generating members, for intermitting outputting of data through the use of the plurality of on-die termination enable signals.

6. The circuit of claim 5, wherein the first flip-flop member includes:
a first inverter for inverting the on-die termination comparison signal; and
a plurality of latch members for sequentially latching the output of the first inverter through the use of the first and second buffered clocks.

7. The circuit of claim 6, wherein the plurality of latch members includes:
a first latch member having a first transfer gate for transferring the output of the inverter using the first buffered clock of a first level state, and a first invert-parallel-connected inverter for latching the output of the first transfer gate; and
a second latch member having a second transfer gate for transferring the output of the first latch member using the second buffered clock of the first level state, and a second invert-parallel-connected inverter for latching the output of the second transfer gate.

8. The circuit of claim 7, wherein the second flip-flop members include:
a rising clock control latch member having a third transfer gate for transferring the output of the first flip-flop member using a rising clock of the second level state, the rising clock being one of the delayed lock loop clocks, and a third invert-parallel-connected inverter for latching the output of the third transfer gate; and
a falling clock control latch member having a fourth transfer gate for transferring the output of the rising clock control latch member using a falling clock of the second level state, the falling clock being one of the delayed lock loop clocks, and a fourth invert-parallel-connected inverter for latching the output of the fourth transfer gate.

9. The circuit of claim 8, wherein the on-die termination enable signal generating members include:
a fifth inverter for inverting the output of the rising clock control latch member; and
a NAND gate having the output of the fifth inverter and the output of the falling clock control latch member as its input.

10. The circuit of claim 9, wherein the on-die termination drivers include:
a sixth inverter for inverting the on-die termination enable signals;
a PMOS transistor for outputting a power supply voltage in response to the output of the sixth inverter;
a NMOS transistor for outputting a ground voltage VSSQ in response to the on-die termination enable signals; and
a plurality of resistors serially connected between the PMOS transistor and the NMOS transistor.

11. The circuit of claims 3, wherein the increasing member is inverters, which are serially connected in even-number.

12. A circuit for performing an on-die termination ("ODT") operation in a semiconductor memory device, which comprises:
a means for increasing a driving force of signals which are outputted to each pad in the semiconductor memory device so as to perform the on-die termination operation; and
a means for controlling the output signals from the driving force increasing means through the use of delayed lock loop clocks outputted from a delayed lock loop, wherein the means is parallel-connected in plural number.

13. The circuit of claim 12, wherein the driving force increasing member is inverters, which are serially connected in even-number.

14. A method for performing an on-die termination ("ODT") operation in a semiconductor memory device, which comprises the steps of:
(a) outputting first and second buffered clocks using an external clock and an external inverting clock applied thereto externally;
(b) comparing each other an on-die termination signal and a reference voltage, which are applied thereto from an external chip set, to generate an on-die termination comparison signal;
(c) transferring the on-die termination comparison signal as a plurality of parallel output signals based on the first and second buffered clocks;
(d) increasing a driving force of the plurality of parallel output signals; and
(e) outputting the parallel output signals with an increased driving force based on delayed lock loop clocks outputted from a delayed lock loop.

15. The method of claim 14, further comprises the steps of:
(f) generating on-die termination enable signals for turning on/off a termination resistor through the use of the output at the step (e); and
(g) intermitting outputting of data through the use of the plurality of on-die termination enable signals.

* * * * *